United States Patent
Sun et al.

(10) Patent No.: US 6,217,715 B1
(45) Date of Patent: Apr. 17, 2001

(54) COATING OF VACUUM CHAMBERS TO REDUCE PUMP DOWN TIME AND BASE PRESSURE

(75) Inventors: Bingxi Sun; Imran Hashim, both of Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/796,171

(22) Filed: Feb. 6, 1997

(51) Int. Cl.$^7$ .................................................... C23C 14/34
(52) U.S. Cl. ........................ 204/192.12; 204/192.15; 204/192.17; 204/192.22; 204/298.06; 204/298.11; 204/298.12
(58) Field of Search .................. 204/192.12, 192.15, 204/192.17, 192.22, 298.06, 298.08, 298.11, 298.12

(56) References Cited

U.S. PATENT DOCUMENTS

| | | | |
|---|---|---|---|
| 3,540,993 | * 11/1970 | Wurm et al. | 204/298.07 |
| 3,619,402 | * 11/1971 | Wurm et al. | 204/298.12 |
| 5,178,739 | * 1/1993 | Barnes et al. | 204/192.12 |
| 5,232,571 | * 8/1993 | Braymen | 204/192.22 |
| 5,358,615 | * 10/1994 | Grant et al. | 204/192.15 |
| 5,380,414 | * 1/1995 | Tepman | 204/298.11 |

FOREIGN PATENT DOCUMENTS

| | | |
|---|---|---|
| 59-190363 | 10/1984 | (JP) . |
| 59-197566 | 11/1984 | (JP) . |
| 03014227 | 1/1991 | (JP) . |
| 07018433 | 1/1995 | (JP) . |

OTHER PUBLICATIONS

Vossen et al., "Thin Film Processes", pp. 41, 1978.*
"Impedance Matching Circuit For RF Sputtering Systems," IBM Technical Disclosure Bulletin, Dec. 1976, pp. 2809–2810.
W.W. Carson, "Getter Pumping to Allow Economical Sputtering With Xenon," Thin Solid Films, vol. 40, 1977, pp. 385–392.
Elsevier Science Publishers B.V., Journal of Nuclear Materials 162–164 (1989), Boronization in Textor, pp. 713–723.
Materials Science and Engineering, A163 (1993) LaB6 Coating to Reduce the Outgassing Rate of a Vacuum Wall, pp. 177–179.
R. H. Stulen and R. Bastasz, Physical Research Division, Sandia Laboratories, Surface Segregation of Boron in Nitrogen–Strengthened Stainless Steel, pp. 940–945.
S. Tsukahara, K. Saitoh, S. Inayoshi and K. Onoe, Outgassing Properties and Structure of TiN Films on Stainless Steel Substrates, pp. 1093–1094.
F. Waelbroeck, Thin Films of Low Z Materials in Fusion Devices, pp. 821–834.

* cited by examiner

Primary Examiner—Rodney G. McDonald
(74) Attorney, Agent, or Firm—Thomason, Moser & Patterson LLP

(57) ABSTRACT

Internal surfaces of a vacuum chamber are coated with a metal or metal oxide to reduce pump down time and base pressure. The metal is sputter deposited within a partially assembled chamber from a target which comprises the metal. The chamber is then configured to process a substrate such as a silicon wafer.

13 Claims, 4 Drawing Sheets

COATING OF VACUUM CHAMBERS TO REDUCE PUMP DOWN TIME AND BASE PRESSURE

FIELD OF THE INVENTION

The present invention relates generally to vacuum chambers used in semiconductor processing, and more specifically to a method and apparatus for modifying the vacuum chambers to enhance performance of the vacuum chambers.

BACKGROUND OF RELATED ART

Thin film deposition apparatus and techniques are used, among other techniques, to provide thin film layers on semiconductor substrates. An environment in which desired materials are transported in an ultrahigh vacuum to condense on a clean substrate is a preferred processing technique in the fabrication of microdevices. One well known prior art deposition process is physical vapor deposition, generally referred to as sputtering, wherein substrates are typically moved through load locks and into high vacuum processing chambers which enclose the substrate and a target composed of the material desired to be deposited on the substrate. A negative voltage applied to the target excites into a plasma state an inert gas (typically argon) supplied to the chamber, and ions from the plasma bombard the target and eject particles of target material from the target toward the substrate. These particles deposit on the substrate to form the desired film. In some sputtering process applications, the substrate may be heated to temperatures on the order of about 350° C. to about 510° C. or higher, to reflow a film layer deposited on the substrate by sputtering.

The low pressure, high temperature environments typically utilized in deposition processes cause outgassing of contaminants from the substrates and from internal walls of the processing chamber. These contaminants, such as hydrogen ($H_2$), water ($H_2O$) and air (mostly $O_2$ and $N_2$), are released slowly and are often detrimental to the film layer which is deposited onto the substrate. Processes for removing contaminants from substrates prior to processing have been developed and typically include degas chambers located near the front of a cluster tool or otherwise in the preliminary steps of substrate processing.

Contaminants which are outgassed from the processing chamber walls should also be removed from the processing chambers to improve the processing environment. However, outgassing of the chamber walls continues for many hours and it is not feasible to draw out all of the contaminants prior to processing of wafers in the processing chamber. A typical method for reducing outgassing from a vacuum chamber is a baking procedure, during which the chamber is heated to a temperature typically in the range of 120° C.–300° C. for several hours. The thermal energy helps to desorb gas species from chamber walls and the desorbed species are pumped away. A much lower chamber base pressure is thus achieved. The chamber pressure is raised to processing pressure by adding a clean gas during processing. Since contamination due to outgassing is very small, a clean processing environment is obtained.

Processing systems for work pieces such as semiconductor substrates incorporate multiple, isolated vacuum stages between the cassette load lock station and the main vacuum processing chambers. A multistaged vacuum is used between the cassette load lock and the main processing chambers to minimize cross-contamination and allow the use of a ultrahigh vacuum ($\leq 10^{-8}$ Torr) in the processing chambers without lengthy pumpdown times. Pre-treatment chambers, such as degas chambers, are typically incorporated in the transport paths of substrates. One such processing system is the Endura® Platform which is commercially available from Applied Materials, Inc. The Endura® Platform includes a staged vacuum architecture for achieving very low pressures. Pre-treatment chambers can be dedicated to pre-treating (e.g., plasma etch cleaning, vacuum cleaning and/or heating) of the substrates before processing. A combination of a roughing pump and a cryogenic pump is typically used to provide the vacuum in the degas chambers and the processing chambers. The roughing pump can reduce the chamber pressure to about $10^{-3}$ torr, and the cryogenic pump can then reduce the chamber pressure to about $10^{-8}$ torr.

Sputter deposition of aluminum films on semiconductor substrates is an application in which an ultra-high vacuum at high temperatures is especially desirable. The ultra high vacuum is used to achieve low outgassing of contaminants and removal thereof from the chamber. The chamber pressure for sputtering, commonly as high as the milli-torr range, is achieved by first evacuating the chamber to an ultra high vacuum pressure as low as the $10^{-8}$ torr range to reduce outgassing of contaminants from the chamber walls, and then re-filling ("back filling") the chamber with a clean process gas at a total chamber pressure regulated at about $10^{-3}$ torr.

The time required to pump down processing chambers to the $10^{-8}$ torr range occupies a significant portion of the process time for each substrate, and the inability to achieve lower pressures hinders the removal of contaminants. Therefore, there is a need for a method and apparatus for reducing outgassing of contaminants from the processing chamber walls. By reducing the outgassing of contaminants, the quality of the deposition layers, and devices formed as a result of such deposition, will be greatly improved.

SUMMARY OF THE INVENTION

The present invention provides a vacuum processing chamber having a metal or metal oxide layer disposed on the internal chamber walls to reduce the pump down time and the base pressure prior to high vacuum processing of a substrate such as a silicon wafer. The invention further provides a method and apparatus for depositing a metal containing layer on the internal chamber walls to reduce outgassing of contaminants from the chamber walls. The metal containing layer is deposited by sputtering a target comprising the metal within the processing chamber. The target can be a conventional circular target or coiled target which serves as a RF or DC antenna. The target is preferably mounted in a removable chamber lid which can be used to condition multiple chambers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The present invention provides a vacuum processing chamber having a metal or metal oxide layer coated on the internal chamber surfaces which coating reduces outgassing of contaminants. This layer can initially be produced by depositing the metal or metal oxide layer on interior surfaces of individual components prior to assembly of the vacuum chamber. The chamber coating is preferably produced by a process comprising the steps of positioning a target within the vacuum chamber, the target comprising a metal to be deposited on internal surfaces of the vacuum chamber, filling the vacuum chamber with an inert gas to provide a chamber pressure sufficient to strike a plasma, and providing sufficient RF or DC power to the target to sputter material from the target and deposit the material onto the internal surfaces of the vacuum chamber. Depositing the metal or metal oxide layer after assembly of the chamber walls is preferred since the layer is easily damaged during chamber assembly.

The metal or metal oxide layer is deposited prior to assembly of internal chamber components or after removal of the internal components. Deposition follows installation of sputtering hardware in the partially assembled chamber as described in more detail below. The chamber is pumped down to a base pressure sufficient to outgas chamber walls and then filled with an inert gas such as argon to a pressure sufficient to strike a plasma. The metal is then sputtered onto the chamber walls to reduce outgassing of contaminants from the chamber walls. The sputtering hardware is removed and the chamber is then configured for processing a substrate such as a silicon wafer.

A preferred metal for sputtering on the chamber walls is titanium which oxidizes to titanium oxide when exposed to air or when repeatedly exposed to process gases that are slightly contaminated with oxygen. The barrier properties of titanium do not appear to be impaired by oxidation.

The process of sputtering is a physical vapor deposition (PVD) technique in which a solid material, such as titanium, titanium nitride, or aluminum, is bombarded with ions to eject the solid material and deposit the ejected material onto a work piece, such as a silicon wafer. PVD processing chambers typically have a target of the solid material and a DC or RF voltage is applied to the solid material with or without a magnetron to generate a plasma in the region between the solid material and the work piece. The high energy ions in the plasma, such as argon ions, bombard the solid material and dislodge metal atoms. The metal atoms or particles may have various trajectories that cause deposition on a desired surface, as well as on the chamber walls and other chamber components. Furthermore, particle trajectories may be changed by interaction with the plasma or collisions with gas molecules or the like.

Figure 1:
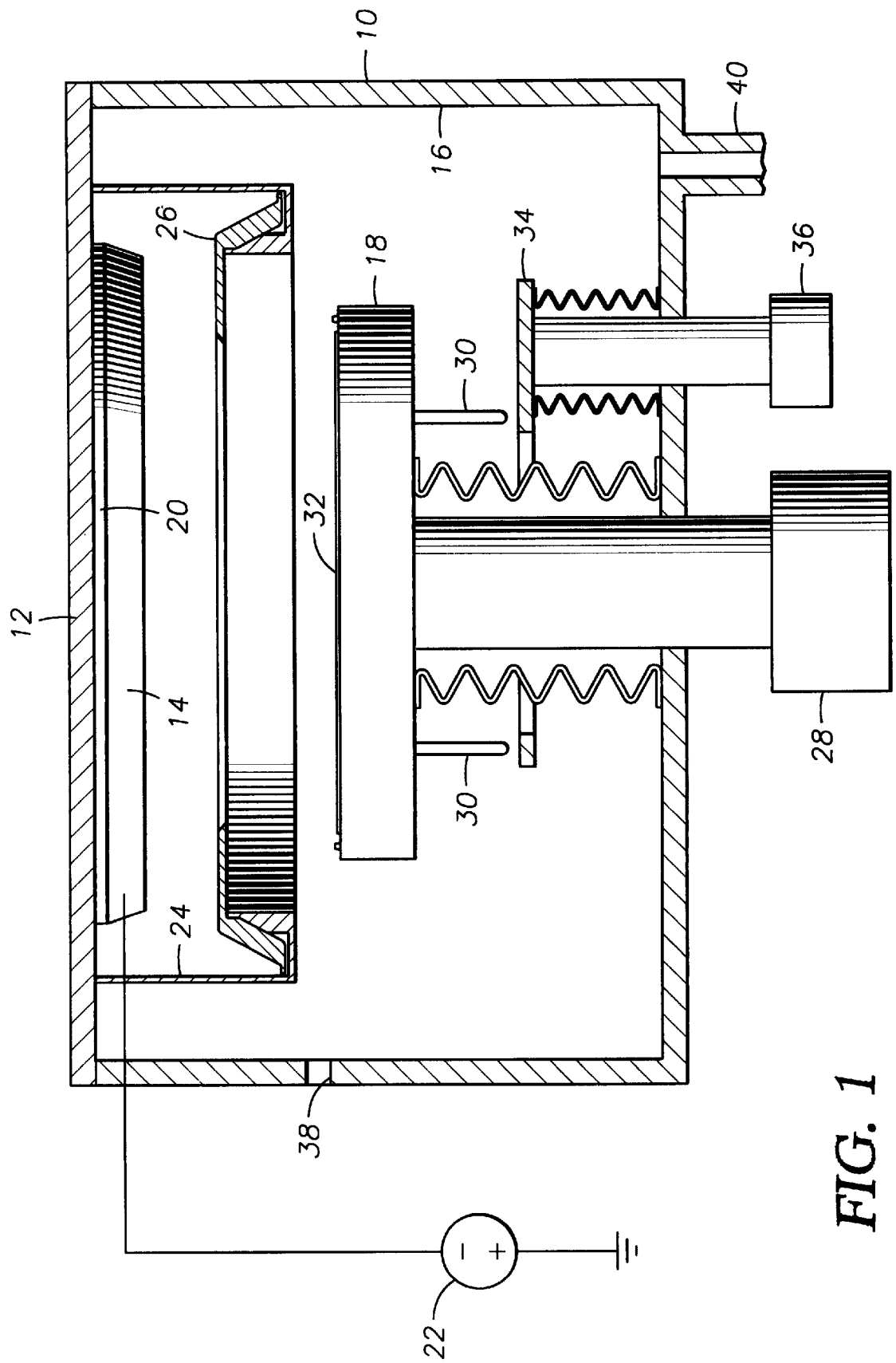
FIG. 1 is a cross-sectional schematic view of a processing chamber having a titanium oxide layer disposed on internal chamber walls according to the present invention.

FIG. 1 is a cross-sectional schematic view of a PVD processing chamber which has been modified in accordance with the present invention. The non-modified processing chamber is preferably a wide-body PVD chamber manufactured by Applied Materials, Inc. However, any vacuum processing chamber can be modified to have a metal or metal oxide layer on internal surfaces which reduces outgassing in accordance with the present invention. The modified PVD chamber has a chamber body 10 and a chamber lid 12, both typically constructed from stainless steel, however, other materials known in the art can be used for the chamber body and the chamber lid. The chamber lid 12 supports a conventional sputtering target 14 which typically comprises a material to be deposited on a wafer. The chamber body 10 generally includes internal chamber walls 16 which, for the present invention, comprise a deposited metal or metal oxide layer that blocks outgassing of contaminants. The metal or metal oxide layer has a thickness of between about 50 Å and several microns, preferably about 100 Å. The metal or metal oxide layer is preferably a titanium oxide layer, but can be any material which is a barrier to passage of contaminants. The modified chamber futher comprises a substrate support pedestal 18 movably disposed at the lower end of the chamber below the target 14. The target 14 is secured to an insulating material 20 which is disposed between the target 14 and the chamber lid 12 and electrically isolates the target 14 from the chamber lid 12. The insulating material 20 is typically a non-conductive material such as aluminum oxide.

The chamber body 10 is preferably grounded so that an RF or DC power source 22 can bias the target 14. The power source 22 preferably provides from about 100 W to about 1 KW of RF power to establish a negative bias on the target 14 with respect to the grounded chamber body 10. A sputter shield 24 is optionally suspended from the chamber body 10 around the target 14 to reduce sputtering of the internal chamber walls 16. The sputter shield 24 typically supports a clamp ring 26 which is suspended over the substrate support pedestal 18 when the pedestal 18 is retracted downwardly in the chamber. The substrate support pedestal 18 is lowered by a pedestal drive mechanism 28 located outside the chamber body 10. The pedestal 18 houses three or more vertically slidable pins 30 for lifting or lowering wafers with respect to the pedestal 18 which supports a wafer 32. When the pedestal 18 is in a lowered position, a lift platform 34 is raised by a platform drive mechanism 36 and pushes the slidable pins 30 through the pedestal 18 to lift the wafer 32.

Processing platforms which support the processing chamber include one or more robot arms (not shown) which transfer the wafer 32 onto the raised slidable pins 30. The platform drive mechanism 36 lowers the pins 30 and places the wafer on the pedestal. The pedestal drive mechanism 28 then raises the pedestal 18 until the wafer 32 is an appropriate distance from the target 14. When the clamp ring 26 is used, the wafer 32 contacts the clamp ring 26 and lifts the clamp ring off the sputter shield 24.

Processing platforms which support the processing chamber further include a gas source for supplying an inert gas such as argon to gas inlets 38 in the chamber body 10 and a vacuum system for evacuating the processing chamber through a vacuum port 40 on the chamber body 10. The processing chamber is typically prepared for sputtering with RF power by evacuating the chamber to between about $10^{-6}$ to about $10^{-8}$ Torr before back-filling the chamber with argon to a pressure from about 1 mTorr to about 100 mTorr. At these gas pressures, the distance between the target 14 and the wafer 32 can be less than the mean free path of the argon gas molecules. Therefore, many sputtered particles travel directly to the wafer 32 without colliding with other particles.

The metal or metal oxide layer included in the internal chamber walls 16 can be deposited prior to assembly of the chamber. However, the layer will need to be replaced periodically and is conveniently deposited in situ in a vacuum processing chamber using the apparatus shown in FIG. 2. The apparatus takes advantage of the availability of a vacuum system and gas source on a processing platform which supports the processing chamber. The apparatus can be used to deposit any metal containing layers such as titanium, titanium nitride, lanthanum hexaboride, and the like.

Figure 2:
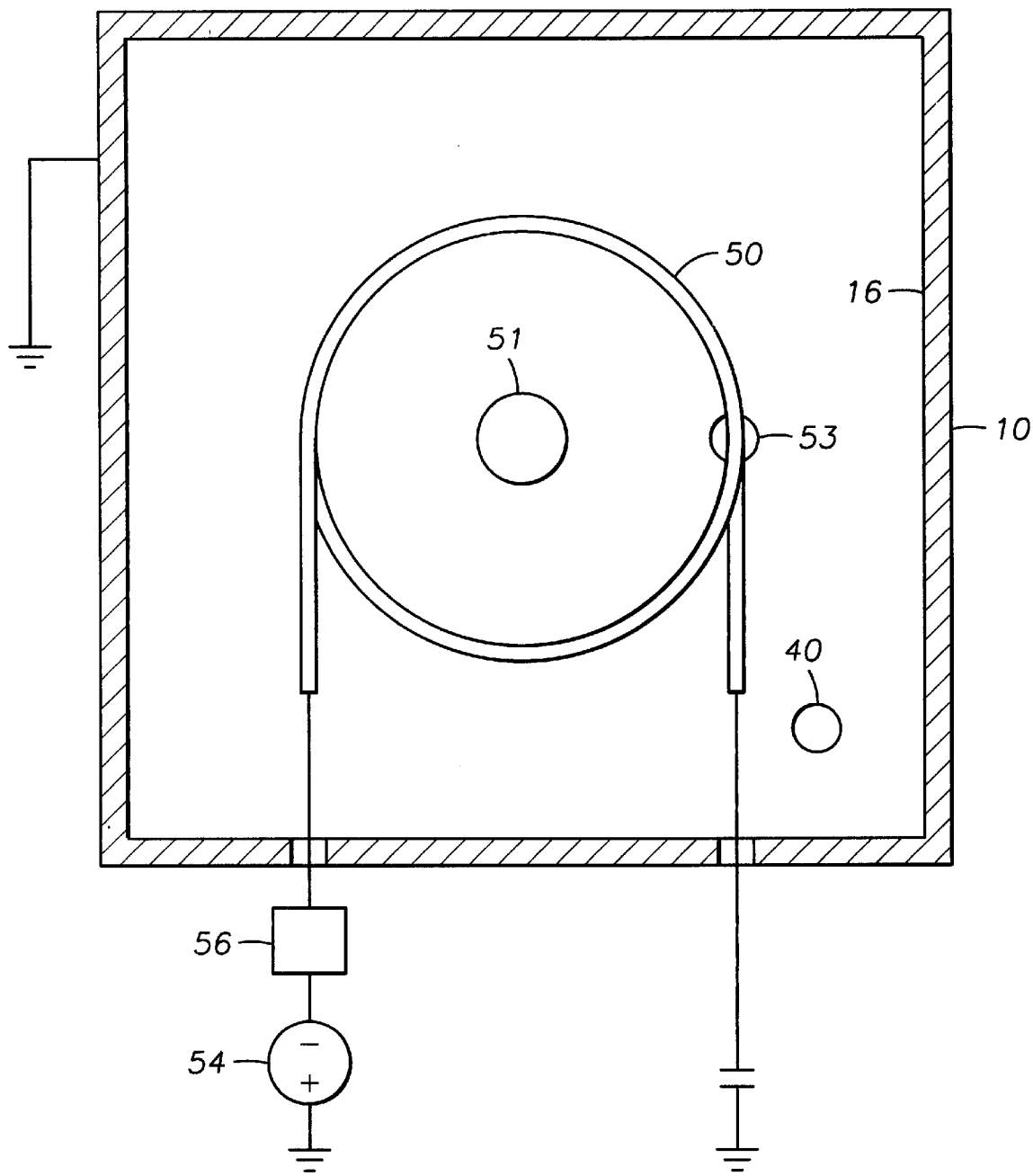
FIG. 2 is a schematic view of an apparatus for depositing a metal containing layer on the internal chamber walls of a vacuum chamber.

Referring to FIG. 2, the processing chamber of FIG. 1 was prepared for sputter deposition of a titanium layer on the internal chamber walls 16 by removing the substrate support pedestal, the lift platform, the target, the clamp ring, and the sputter shield. The chamber body 10 and the chamber lid 12 remain, however, the deposition of titanium on the lid 12 is not necessary and can be avoided by using an alternative method described below. A target, such as a titanium wire coil 50, is positioned within the processing chamber prior to sealing of the lid 12. All openings in the chamber body must be sealed such as holes 31, 34 remaining after removal of the support pedestal 18 and the lift platform 34. Several openings in the chamber body are used to supply RF power to one end of the titanium wire coil 50 and to ground the other end through a capacitor 52. The chamber body is grounded and all connections to the titanium wire coil 50 must be insulated when passing through the chamber body 10. RF power is supplied by an RF source 54 and an RF match unit 56.

The metal in the target, such as titanium in the titanium wire coil 50, is sputtered to the chamber walls by evacuating the chamber through the vacuum port 40 and striking a plasma. The chamber is grounded, and a voltage/bias from −50 V to −5,000 V on the coil 50 causes ionization of a portion of a background gas, preferably argon, into a plasma. The chamber is preferably evacuated to a base pressure of about $10^{-8}$ Torr before filling with argon to a chamber pressure from 5 to 100 milliTorr. The deposition does not need to be uniform and should continue until most surfaces have at least a 50 Å layer deposited thereon. However, extremely non-uniform layers should be avoided since titanium layers exceeding several microns may flake from the surface. Person skilled in the art can modify the shape of the titanium wire coil 50 or other target as needed to avoid depositing titanium layers that vary in thickness from less than 50 Å to more than several microns.

The thin titanium layer will quickly oxidize to titanium oxide if the chamber is opened to air for assembly of the internal components or if used with process gases that contain small amounts of oxygen. Titanium oxide is also an effective barrier to the passage of contaminants from the chamber walls.

Although sputtering of the titanium wire coil 50 with DC power is contemplated, it has been found that sputtering of the coil 50 with RF power is superior with respect to the process of this invention since the pressure range for DC sputtering is narrow and has a narrow process control range in comparison to RF bias. The sputtering yield depends on the ion density and ion energy which are easily controlled for RF sputtering by changing the size of the capacitor 52.

Figure 3:
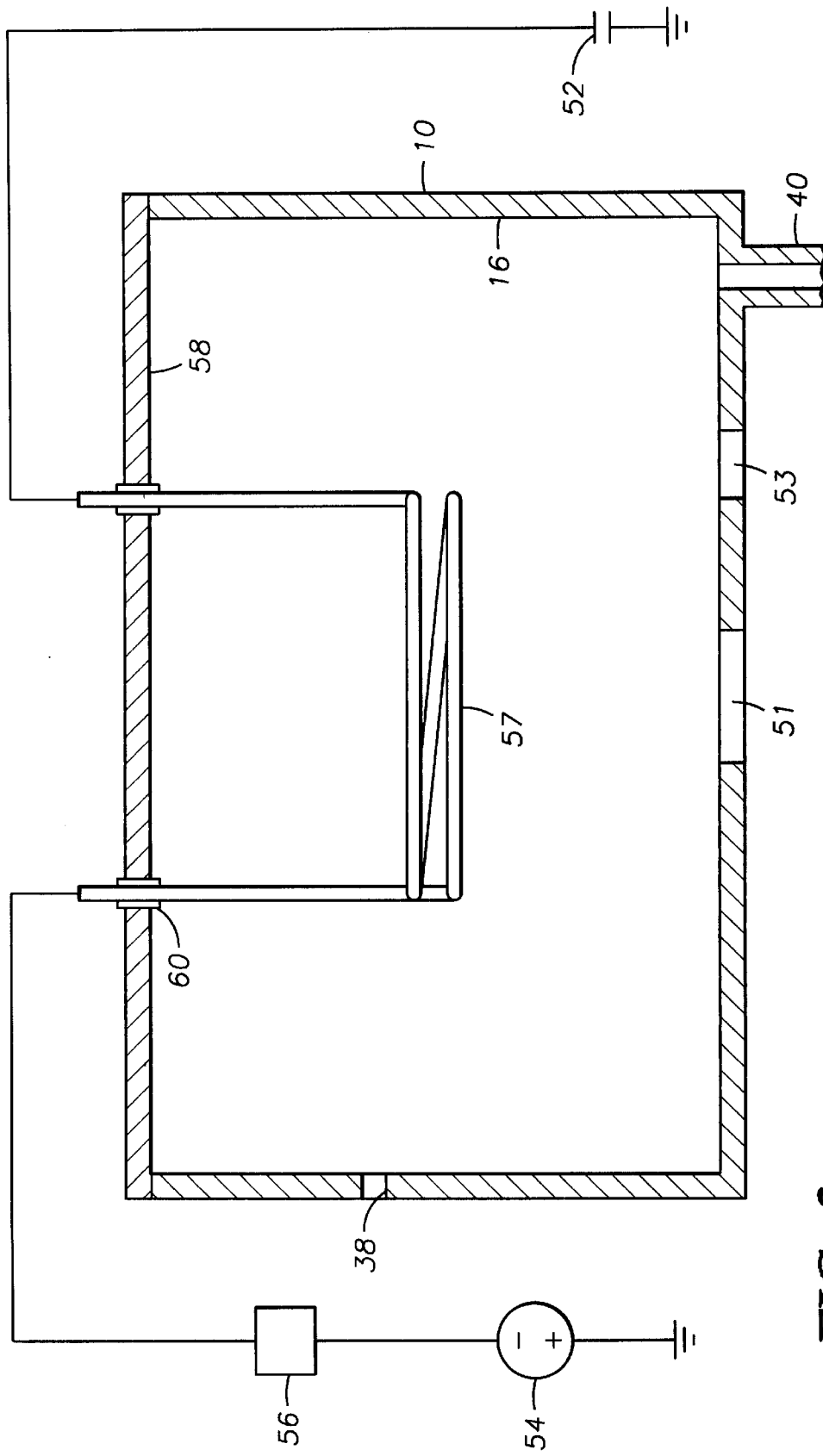
FIG. 3 is a schematic view of an alternative apparatus for depositing a metal containing layer on the internal chamber walls of a vacuum chamber.

FIG. 3 shows a preferred apparatus and method for depositing a metal containing layer on the internal chamber walls of a processing chamber. The apparatus includes an RF antenna 57 comprising the metal, the RF power source 54, and the RF match unit 56 previously described for the apparatus shown in FIG. 2. However, the RF antenna 57 is secured in a modified lid 58 using insulators 60 to isolate the RF antenna from the chamber body 10. The surface of the RF antenna 50 is preferably parallel to the surface of the chamber lid 58 which allows the greatest separation between the RF antenna and the chamber components.

A processing chamber having a titanium oxide layer on the internal chamber walls was prepared according to the present invention by depositing titanium on the internal chamber walls of a wide body PVD processing chamber manufactured by Applied Materials, Inc. The titanium was deposited with an argon plasma at a chamber pressure of about 50 mTorr using a titanium wire coil as shown in FIG. 2. RF power was supplied to the coil at −350 V for 5 minutes at 300 W and 13.56 MHz. The titanium layer deposited on the walls had a minimum thickness of 50 Å and an average thickness of about 90 Å. Prior to deposition of the titanium layer, the pumpdown performance and minimum achievable base pressure of the unmodified processing chamber was determined by repeatedly pumping down the chamber for about 15 hours each cycle. After deposition of the titanium layer, which oxidized to titanium oxide, the modified processing chamber was repeatedly pumped down for about 15 hours each cycle to measure any improvement in pumpdown performance or minimum achievable base pressure. Experimental results for the pumpdown tests on the modified and unmodified chamber are shown in FIG. 4.

Figure 4:
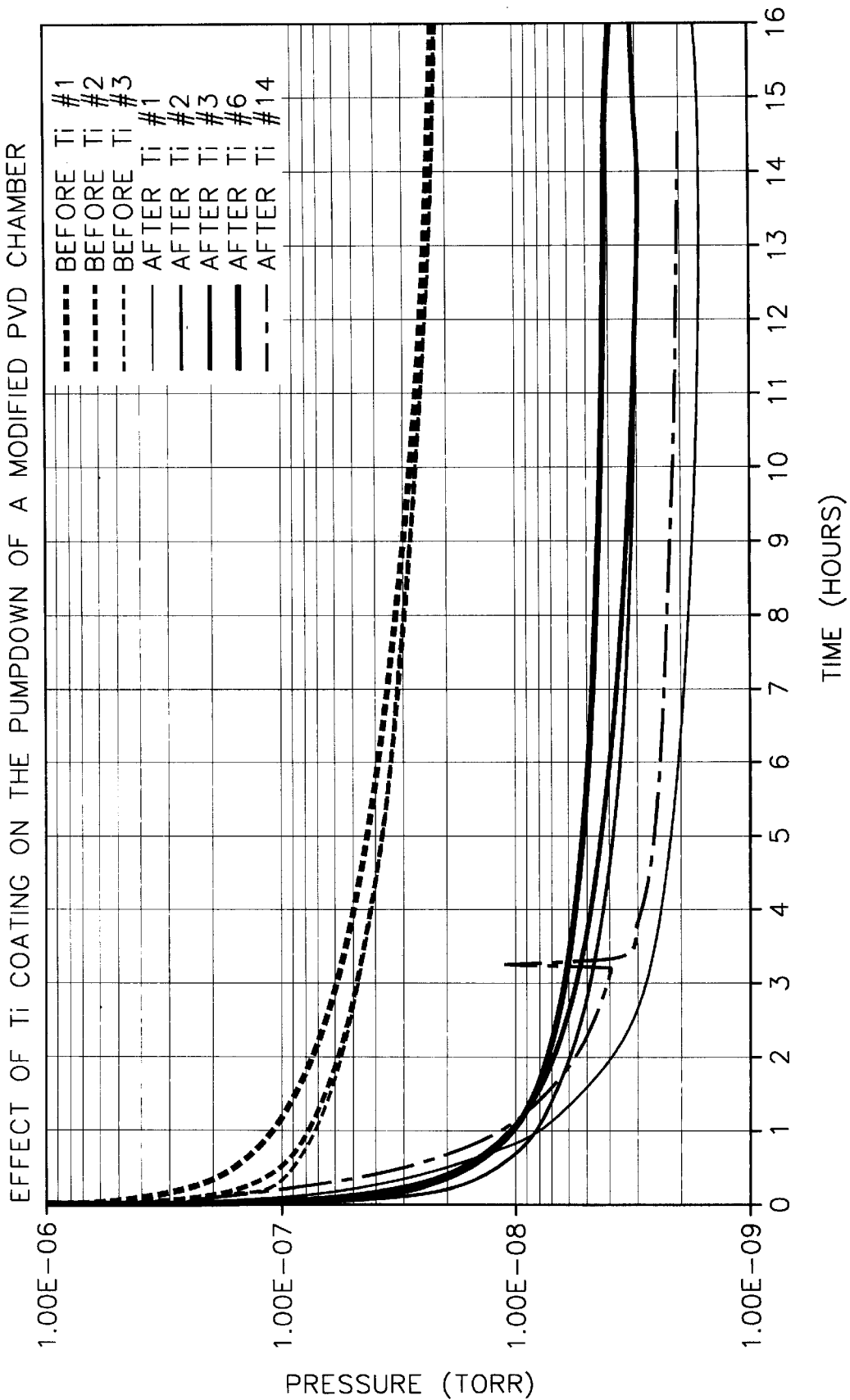
FIG. 4 compares the pump down times and base pressures for a chamber before and after a metal layer is deposited on the internal chamber walls.

Referring to FIG. 4, the modified processing chamber of the present invention, having a titanium oxide layer on internal chamber walls and configuration as a sputtering chamber as shown in FIG. 1, achieved significantly lower base pressures with significantly improved pumpdown performance. For example, the modified chamber routinely achieved base pressures lower than $1\times10^{-8}$ torr in 1 hour or less and lower than $4\times10^{-9}$ torr after 13 hours. The only exception was the 14th cycle which had a dirty ion gauge which outgassed additional contaminants during the first few hours of the cycle. After degassing the ion gage, good base pressure was obtained. In comparison, the base pressure of the non-modified processing chamber remained above $7\times10^{-8}$ torr at one-hour into each cycle and above $2\times10^{-8}$ torr after 15 hours. The improvement in pump down time and base pressure results in outgassing of fewer contaminants from the chamber walls during wafer processing.

While the foregoing is directed to preferred embodiments of the present invention, other and further embodiments of the invention may be devised without departing from the basic scope thereof, and the scope thereof is determined by the claims which follow.

What is claimed is:

1. A method for preparing a vacuum chamber for processing substrates, comprising:

positioning a target within a partially assembled vacuum chamber, the target comprising a metal to be deposited on the internal walls of the vacuum chamber; and sputtering the target to deposit the metal on the internal walls to seal the internal walls against outgassing of contaminants; and exposing the sputtered metal to an oxygen containing atmosphere to form a metal oxide layer on the vacuum chamber prior to substrate processing.

2. The method of claim 1, wherein the target comprises titanium.

3. The method of claim 2, wherein the target is a titanium wire coil.

4. The method of claim 3, wherein the titanium wire coil extends through insulated holes in grounded surfaces of the vacuum chamber.

5. The method of claim 3, wherein the titanium wire coil extends through a removable surface of the vacuum chamber.

6. The method of claim 5, wherein the removable surface of the vacuum chamber is a removable chamber lid.

7. The method of claim 6, wherein the vacuum chamber is a physical vapor deposition chamber.

8. The method of claim 1, wherein the target is sputtered with an argon plasma.

9. A vacuum chamber having a metal layer deposited on internal surfaces thereof, the metal oxide layer being formed by the process, comprising:

positioning a target made at least partially of the metal to be deposited in the chamber;

sputtering the target to deposit the metal layer on the internal surfaces of the chamber; and exposing the sputtered metal to an oxygen containing atmosphere to form a metal oxide layer on the vacuum chamber prior to substrate processing.

10. The vacuum chamber of claim 9, wherein the target comprises titanium.

11. The vacuum chamber of claim 9, wherein the target is a titanium wire coil and extends through insulated holes in grounded surfaces of the vacuum chamber.

12. The vacuum chamber of claim 9, wherein the vacuum chamber is a physical vapor deposition chamber.

13. The vacuum chamber of claim 9, wherein the target is sputtered with an argon plasma.

* * * * *

UNITED STATES PATENT AND TRADEMARK OFFICE
CERTIFICATE OF CORRECTION

PATENT NO.    : 6,217,715 B1
DATED         : April 17, 2001
INVENTOR(S)   : Sun et al.

It is certified that error appears in the above-identified patent and that said Letters Patent is hereby corrected as shown below:

<u>Title page,</u>
Item [75], please replace "Bingxi Sun; Imran Haskim, both of Sunnyvale, CA (US)" with -- Bingxi Sun, Sunnyvale; Imran Hashim, Fremont, both of CA (US) --.

<u>Column 4,</u>
Line 19, please replace "fulter" with -- further --.

Signed and Sealed this

Sixth Day of August, 2002

Attest:

Attesting Officer

JAMES E. ROGAN
*Director of the United States Patent and Trademark Office*